(12) United States Patent
Pagaila

(10) Patent No.: US 8,969,136 B2
(45) Date of Patent: Mar. 3, 2015

(54) INTEGRATED CIRCUIT PACKAGING SYSTEM FOR ELECTROMAGNETIC INTERFERENCE SHIELDING AND METHOD OF MANUFACTURE THEREOF

(75) Inventor: Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 132 days.

(21) Appl. No.: 13/072,603

(22) Filed: Mar. 25, 2011

(65) Prior Publication Data

US 2012/0241922 A1 Sep. 27, 2012

(51) Int. Cl.
| | | |
|---|---|---|
| H01L 23/552 | (2006.01) | |
| H01L 21/56 | (2006.01) | |
| H01L 21/48 | (2006.01) | |
| H01L 23/495 | (2006.01) | |
| H01L 23/00 | (2006.01) | |
| H01L 23/31 | (2006.01) | |

(52) U.S. Cl.
CPC .......... *H01L 21/561* (2013.01); *H01L 21/4832* (2013.01); *H01L 23/49582* (2013.01); *H01L 23/552* (2013.01); *H01L 24/97* (2013.01); H01L 23/3107 (2013.01); H01L 2224/32245 (2013.01); H01L 2224/48247 (2013.01); H01L 2224/73265 (2013.01); H01L 2224/97 (2013.01); H01L 2924/01029 (2013.01); H01L 2924/01047 (2013.01); H01L 2924/01082 (2013.01); H01L 24/48 (2013.01); H01L 2924/01024 (2013.01); H01L 2924/01033 (2013.01); H01L 2924/014 (2013.01); H01L 2924/3025 (2013.01)
USPC .......... 438/112; 438/110; 438/111; 438/113; 438/123; 438/124

(58) Field of Classification Search
USPC .................. 361/800, 816; 257/659, 666, 787; 438/110–112, 121, 124, 127
See application file for complete search history.

(56) References Cited

U.S. PATENT DOCUMENTS

| | | |
|---|---|---|
| 7,030,469 B2 | 4/2006 | Mahadevan et al. |
| 7,071,545 B1 | 7/2006 | Patel et al. |
| 7,576,415 B2 | 8/2009 | Cha et al. |
| 7,714,419 B2 | 5/2010 | Camacho et al. |
| 7,902,644 B2 | 3/2011 | Huang et al. |
| 8,084,300 B1 * | 12/2011 | San Antonio et al. ......... 438/114 |
| 2006/0033184 A1 * | 2/2006 | Park et al. ..................... 257/666 |
| 2006/0148317 A1 * | 7/2006 | Akaike et al. ................. 439/607 |
| 2007/0267734 A1 | 11/2007 | Zhao et al. |
| 2008/0308912 A1 * | 12/2008 | Cha et al. ...................... 257/659 |
| 2009/0014847 A1 | 1/2009 | Chen et al. |
| 2009/0146269 A1 | 6/2009 | Chow et al. |
| 2009/0212401 A1 | 8/2009 | Do et al. |
| 2009/0230526 A1 * | 9/2009 | Chen et al. .................... 257/676 |
| 2010/0072582 A1 | 3/2010 | Chandra et al. |
| 2011/0115066 A1 * | 5/2011 | Kim et al. ..................... 257/690 |

* cited by examiner

*Primary Examiner* — Colleen A Matthews
*Assistant Examiner* — William Harriston
(74) *Attorney, Agent, or Firm* — Ishimaru & Associates LLP

(57) ABSTRACT

A method of manufacture of an integrated circuit packaging system includes: providing a lead frame having a die attach paddle pad and a peripheral lead pad with an inner lead pad between the die attach paddle pad and the peripheral lead pad; forming a component side of the lead frame for exposing an upper portion of a peripheral lead under the peripheral lead pad; forming an encapsulation on the lead frame and the upper portion of the peripheral lead; exposing the peripheral lead pad; depositing a conductive shielding layer on the encapsulation connected to the peripheral lead pad; and forming a mounting side of the lead frame for forming a lower portion of the peripheral lead over a peripheral lead contact pad.

10 Claims, 10 Drawing Sheets

INTEGRATED CIRCUIT PACKAGING SYSTEM FOR ELECTROMAGNETIC INTERFERENCE SHIELDING AND METHOD OF MANUFACTURE THEREOF

TECHNICAL FIELD

The present invention relates generally to integrated circuit packaging system, and more particularly to a system for providing electromagnetic interference shielding.

BACKGROUND ART

Modern electronic devices, for example cellular phones, personal audio/video players, hand held video games, and global positioning systems, require a seamless integration of analog and digital subsystems. Furthermore, premiums are often placed on small size, complexity, and high performance. Thus, highly sensitive analog circuits frequently need to be placed very close to high-speed digital systems.

High-speed digital systems can switch at more than one billion times a second. At such switching speeds, switching currents tend to be high. Thus, such high-speed digital systems can radiate energy that interferes with highly sensitive analog circuits. Interference usually takes the form of signal crosstalk. While faraday shielding has been widely used to protect highly sensitive analog circuits from interference, the traditional faraday shields tend to be expensive both in space and labor content. Furthermore, their implementation must be undertaken with great foresight to determine where to install the shields, and with great care to actually protect the analog circuits. Moreover, the traditional faraday shield is not particularly flexible.

Traditionally, an integrated circuit is supplied as part of a semiconductor package having external leads for soldering, or otherwise connecting, to a printed circuit board. For example, surface mount leadless packages have been widely used with integrated circuit chips. In such packages, an integrated circuit chip is encapsulated in a ceramic or plastic housing having electrical leads that are suitable for soldering to a circuit board. Bonding conductors, which are also encapsulated in the housing, extend from the upper part of the electrical leads, which are within the package, to electrical pads on the integrated circuit chip.

Thus, a need still remains for integrated circuit packaging system that provides electromagnetic interference shielding of a component mounted therein. More beneficial would be a low cost semiconductor package that enables dense packaging of integrated circuit chips, together with electrical and electromagnetic interference shielding of those chips. In view of the increasing demand for small and highly integrated electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system includes: providing a lead frame having a die attach paddle pad and a peripheral lead pad with an inner lead pad between the die attach paddle pad and the peripheral lead pad; forming a component side of the lead frame for exposing an upper portion of a peripheral lead under the peripheral lead pad; forming an encapsulation on the lead frame and the upper portion of the peripheral lead; exposing the peripheral lead pad; depositing a conductive shielding layer on the encapsulation connected to the peripheral lead pad; and forming a mounting side of the lead frame for forming a lower portion of the peripheral lead over a peripheral lead contact pad.

The present invention provides an integrated circuit packaging system including: a peripheral lead having a peripheral lead pad; a die attach paddle having a die attach paddle pad with the die attach paddle pad coplanar with the peripheral lead pad; an inner lead between the die attach paddle and the peripheral lead; an encapsulation on the die attach paddle, the inner lead, and the peripheral lead; and a conductive shielding layer on the encapsulation and connected with the peripheral lead pad.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
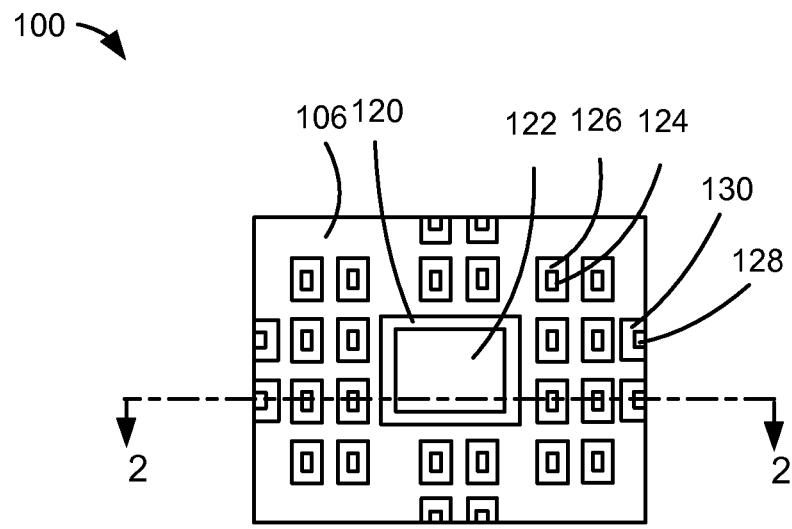
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements or components with no intervening material. The term "processing" as used herein includes stamping, forging, patterning, exposure, development, etching, cleaning, and/or removal of the material or laser trimming as required in forming a described structure.

Referring now to FIG. 1, therein is shown a bottom view of an integrated circuit packaging system 100 in a first embodiment of the present invention. The integrated circuit packaging system 100 can be an integrated circuit package having an electromagnetic interference (EMI) shielding.

The integrated circuit packaging system 100 can include an encapsulation 106. The encapsulation 106 is a cover providing electrical and environmental protections to the structure within the encapsulation 106, such as a protective covering. As an example, the encapsulation 106 can be formed by molding an encapsulation material such as epoxy molding compound or other insulating resin material.

The integrated circuit packaging system 100 can include a die attach paddle 120, a die attach paddle contact pad 122, an inner lead 126, an inner lead contact pad 124, a peripheral lead 130, and a peripheral lead contact pad 128. The die attach paddle 120 is a structural element for supporting an integrated circuit.

The die attach paddle contact pad 122, the inner lead contact pad 124, and the peripheral lead contact pad 128 are conductive elements for mounting the integrated circuit packaging system 100 to the next system level (not shown), such as a printed circuit board or another integrated circuit packaging system. The die attach paddle contact pad 122, the inner lead contact pad 124, and the peripheral lead contact pad 128 can be formed of an etch-resistant material, such as a nickel-chromium alloy. The peripheral lead contact pad 128 can be exposed at a perimeter edge of the integrated circuit packaging system 100.

Figure 2:
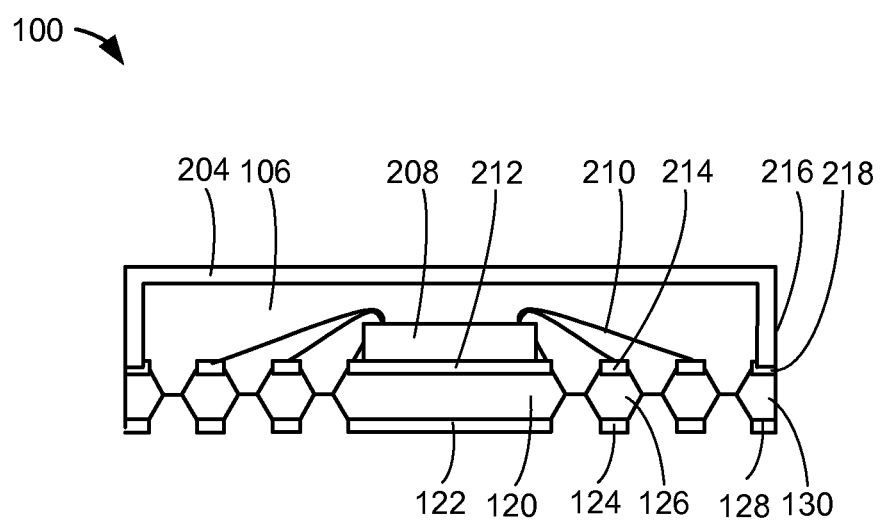
FIG. 2 is a cross-sectional view of the integrated circuit packaging system along a line 2-2 of FIG. 1.

Referring now to FIG. 2, therein is shown a cross-sectional view of the integrated circuit packaging system along a line 2-2 of FIG. 1. The first cross-sectional view of the integrated circuit packaging system 100 can include a conductive shielding layer 204.

The integrated circuit packaging system 100 can include a die attach paddle pad 212, an inner lead pad 214, and a peripheral lead pad 218. The die attach paddle pad 212, the inner lead pad 214, and the peripheral lead pad 218 are conductive elements that can be used to mount components or interconnections. The die attach paddle pad 212, the inner lead pad 214, and the peripheral lead pad 218 can be formed of an etch-resistant material, such as a nickel-chromium alloy.

An integrated circuit 208 can be mechanically coupled to the die attach paddle 120 by an adhesive, such as a die attach material. An electrical interconnect 210, such as bond wires, can electrically connect the inner lead 126 and the inner lead pad 214 with the integrated circuit 208.

The encapsulation 106 can cover the integrated circuit 208 and the electrical interconnect 210. The encapsulation 106 can also cover the die attach paddle pad 212, the inner lead pad 214, and the peripheral lead pad 218. The encapsulation 106 can expose the die attach paddle contact pad 122, the inner lead contact pad 124, and the peripheral lead contact pad 128. The encapsulation 106 can also partially expose and can also partially cover the die attach paddle 120, the inner lead 126, and the peripheral lead 130.

The conductive shielding layer 204, such as a conductive resin, a metal, a conductive foil, or a conductive film, can be formed on the encapsulation 106. The conductive shielding layer 204 can be formed by known methods, such as depositing, plating, sputtering, spraying, painting, rolling, or laminating. The conductive shielding layer 204 can be formed of a two component epoxy containing silver, copper, nickel, an alloy, or other metal. The conductive shielding layer 204 can also be formed of a nickel filled polyurethane or acrylic coating.

The conductive shielding layer 204 can form an electrical connection to the peripheral lead pad 218 and the peripheral lead 130. The peripheral lead 130 can be for coupling a voltage, such as power, a voltage reference, or ground, to the conductive shielding layer 204. The conductive shielding layer 204 can be applied over all of the surfaces of the encapsulation 106, including a lateral side 216.

It has been discovered that exposing the peripheral lead pad 218 allows the conductive shielding layer 204 to form an electrical connection to only the peripheral lead 130 that is exposed. This simplifies the application and reliability of the conductive shielding layer 204. By forming an electrical connection between the conductive shielding layer 204 and the peripheral lead 130 that is coupled to the voltage, such as power, voltage reference, or ground, the conductive shielding layer 204 will also be coupled to the voltage. By coupling the conductive shielding layer 204 to the voltage, the conductive shielding layer 204 will isolate the integrated circuit 208 from any electromagnetic interference that can be present outside the conductive shielding layer 204. The conductive shielding layer 204 can also be used to prevent any electromagnetic interference generated by the integrated circuit 208 from escaping into the system environment beyond the conductive shielding layer 204, thus providing electromagnetic isolation to the system environment.

Figure 3:
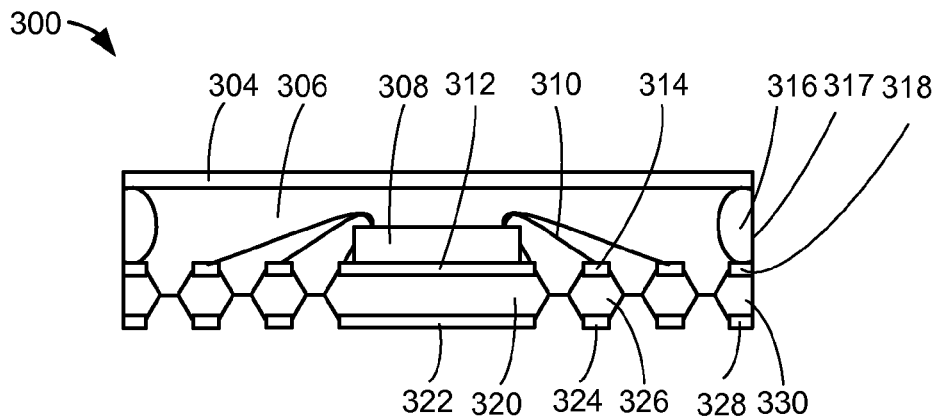
FIG. 3 is a cross-sectional view of an integrated circuit packaging system as exemplified by the bottom view of FIG. 1 along a line 2-2 of FIG. 1 in a second embodiment of the present invention.

Referring now to FIG. 3, therein is shown a cross-sectional view of an integrated circuit packaging system as exemplified by the bottom view of FIG. 1 along a line 2-2 of FIG. 1 in a second embodiment of the present invention. The second cross-sectional view of an integrated circuit packaging system 300 depicts a conductive shielding layer 304 coupled to a peripheral lead 330 with a peripheral interconnect 316.

The integrated circuit packaging system 300 can include a die attach paddle pad 312, an inner lead pad 314, and a peripheral lead pad 318. The die attach paddle pad 312, the inner lead pad 314, and the peripheral lead pad 318 are conductive elements that can be used to mount components or interconnections. The die attach paddle pad 312, the inner lead pad 314, and the peripheral lead pad 318 can be formed of an etch-resistant material, such as a nickel-chromium alloy.

An integrated circuit 308 can be mechanically coupled to a die attach paddle 320 by an adhesive, such as a die attach material. An electrical interconnect 310, such as bond wires, can electrically connect an inner lead 326 and the inner lead pad 314 with the integrated circuit 308.

An encapsulation 306 can cover the integrated circuit 308, and the electrical interconnect 310. The encapsulation 306 can also cover the die attach paddle pad 312, the inner lead pad 314, and the peripheral lead pad 318. The encapsulation 306 can expose a die attach paddle contact pad 322, an inner lead contact pad 324, and a peripheral lead contact pad 328. The encapsulation 306 can also partially expose and can also partially cover the die attach paddle 320, the inner lead 326, and the peripheral lead 330.

The conductive shielding layer 304, such as a conductive resin, a metal, a conductive foil, or a conductive film, can be formed on the encapsulation 306 and on the peripheral interconnect 316. Forming the conductive shielding layer 304 can include depositing, coating, plating, spraying, sputtering, rolling, laminating, applying a film, or any combination thereof. The conductive shielding layer 304 forms an electrical connection with the peripheral interconnect 316 and the peripheral lead pad 318. The conductive shielding layer 304 can also be formed of a two component epoxy containing silver, copper, nickel, an alloy, other metal, a nickel filled polyurethane or acrylic coating, or any combination thereof.

The peripheral interconnect 316 can be formed on the peripheral lead pad 318 or on the peripheral lead 330. The peripheral interconnect 316 can extend from the peripheral lead pad 318 to the top of the encapsulation 306. The peripheral interconnect 316 can include a solder ball, a solder bump, stud bump, pillar, or any combination thereof.

The peripheral interconnect 316 can form an electrical connection between the conductive shielding layer 304, the peripheral lead pad 318, and the peripheral lead 330. The peripheral lead 330 can be for coupling a voltage, such as power, a voltage reference, or ground, to the conductive shielding layer 304. The peripheral interconnect 316 can be exposed on a lateral side 317.

It has been discovered that mounting the peripheral interconnect 316 on the peripheral lead pad 318 allows the formation of a reliable electrical connection between the conductive shielding layer 304 and the peripheral lead pad 318. This can simplify the application and reliability of forming the electromagnetic interference shielding with the conductive shielding layer 304.

Figure 4:
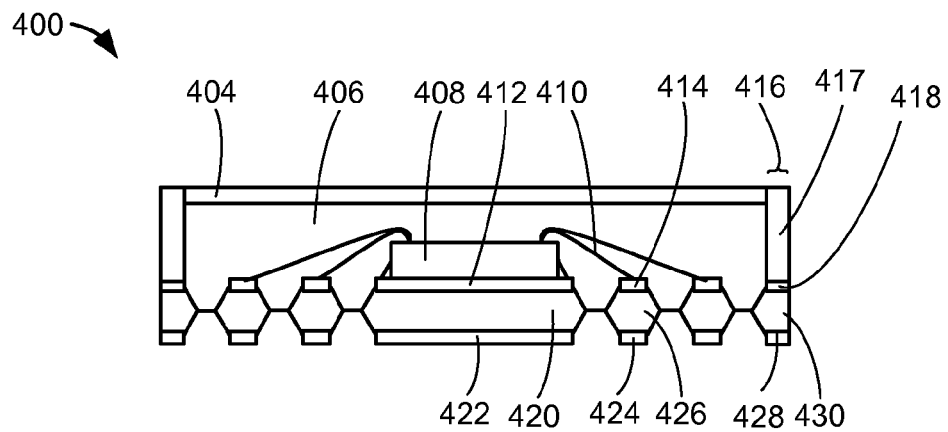
FIG. 4 is a cross-sectional view of an integrated circuit packaging system as exemplified by the bottom view of FIG. 1 along a line 2-2 of FIG. 1 in a third embodiment of the present invention.

Referring now to FIG. 4, therein is shown a cross-sectional view of an integrated circuit packaging system as exemplified by the bottom view of FIG. 1 along a line 2-2 of FIG. 1 in a third embodiment of the present invention. The second cross-sectional view of an integrated circuit packaging system 400 can include a conductive shielding layer 404 coupled to a peripheral lead 430 with a conductive paste plug 416.

The integrated circuit packaging system 400 can include a die attach paddle pad 412, an inner lead pad 414, and a peripheral lead pad 418. The die attach paddle pad 412, the inner lead pad 414, and the peripheral lead pad 418 are conductive elements that can be used to mount components or interconnections. The die attach paddle pad 412, the inner lead pad 414, and the peripheral lead pad 418 can be formed of an etch-resistant material, such as a nickel-chromium alloy.

An integrated circuit 408 can be mechanically coupled to a die attach paddle 420 by an adhesive, such as a die attach material. An electrical interconnect 410, such as bond wires, can electrically connect an inner lead 426 and the inner lead pad 414 with the integrated circuit 408.

An encapsulation 406 can cover the integrated circuit 408 and the electrical interconnect 410. The encapsulation 406 can also cover the die attach paddle pad 412, the inner lead pad 414, and the peripheral lead pad 418. The encapsulation 406 can expose a die attach paddle contact pad 422, an inner lead contact pad 424, and a peripheral lead contact pad 428. The encapsulation 406 can also partially expose and can also partially cover the die attach paddle 420, the inner lead 426, and the peripheral lead 430.

The conductive shielding layer 404, such as a conductive resin, a metal, a conductive foil, or a conductive film, can be formed on the encapsulation 406. The conductive shielding layer 404 can be applied by known methods, such as depositing, plating, sputtering, spraying, painting, rolling, or laminating. The conductive shielding layer 404 can be formed of a two component epoxy containing silver, copper, nickel, an alloy, or other metal. The conductive shielding layer 404 can also be formed of a nickel filled polyurethane or acrylic coating.

The conductive shielding layer 404 can be formed of a two component epoxy containing silver, copper, nickel, an alloy, or other metal. The conductive shielding layer 404 can also be formed of a nickel filled polyurethane or acrylic coating.

The conductive paste plug 416 can be formed on the peripheral lead pad 418. The conductive paste plug 416 can be formed with a conductive paste 417, such as an epoxy containing copper, nickel, an alloy, or other metal.

The conductive paste plug 416 can form an electrical connection from the conductive shielding layer 404 to the peripheral lead pad 418 and the peripheral lead 430. The peripheral lead 430 can be for coupling a voltage, such as power, a voltage reference, or ground, to the conductive shielding layer 404.

It has been discovered that forming the conductive paste plug 416 on the peripheral lead pad 418 creates a reliable electrical connection between the conductive shielding layer 404 and the peripheral lead pad 418. This can simplify the application and reliability of forming the electromagnetic interference shielding with the conductive shielding layer 404.

Figure 5:
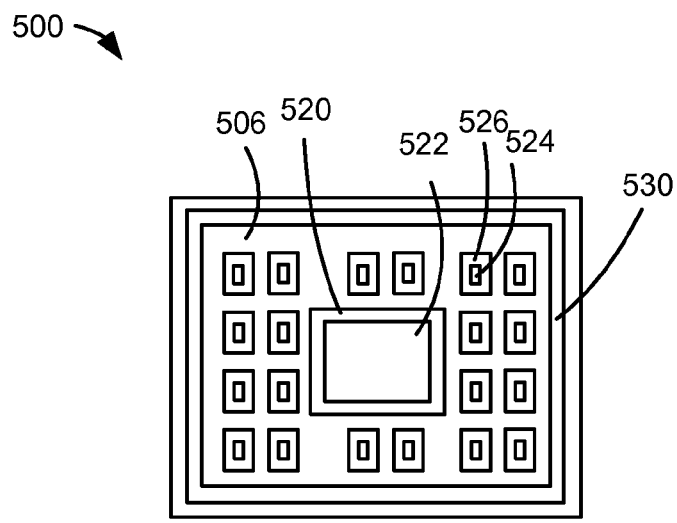
FIG. 5 is a bottom view of an integrated circuit packaging system in a fourth embodiment of the present invention.

Referring now to FIG. 5, therein is shown a bottom view of an integrated circuit packaging system 500 in a fourth embodiment of the present invention. The integrated circuit packaging system 500 can be an integrated circuit package having an Electromagnetic Interference (EMI) Shielding.

The integrated circuit packaging system 500 can include an encapsulation 506. The encapsulation is a cover, such as a protective covering. As an example, the encapsulation 506 can be formed by molding an encapsulation material such as epoxy molding compound or ceramic material.

The integrated circuit packaging system 500 can include a die attach paddle 520, a die attach paddle contact pad 522, an inner lead 526, an inner lead contact pad 524, and a continuous peripheral lead 530.

Figure 6:
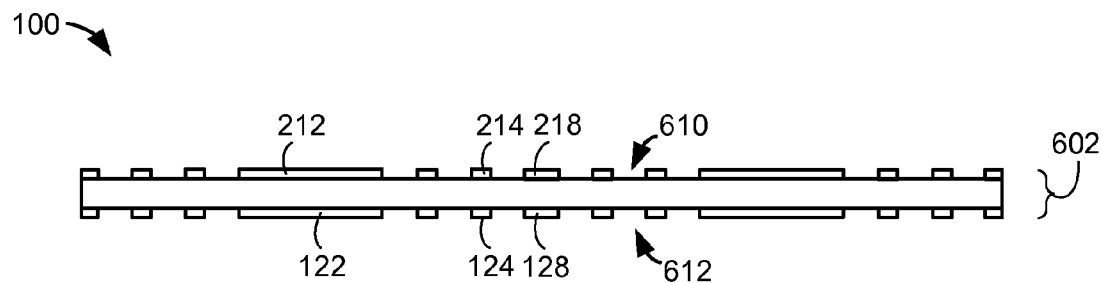
FIG. 6 is the integrated circuit packaging system in FIG. 2 in a manufacturing phase of providing a frame.

Referring now to FIG. 6, therein is shown the integrated circuit packaging system in FIG. 2 in a manufacturing phase of providing a frame. The integrated circuit packaging system 100 can include a lead frame 602 with the die attach paddle pad 212 in an incoming frame phase.

The lead frame 602 can be provided having a component side 610 and a mounting side 612. The component side 610 can include the die attach paddle pad 212, the inner lead pad 214, and the peripheral lead pad 218. The mounting side 612 can include the die attach paddle contact pad 122, the inner lead contact pad 124, and the peripheral lead contact pad 128.

The die attach paddle pad 212 is a conductive element for defining the location of the die attach paddle 120 of FIG. 2 on the component side 610 of the lead frame 602. The die attach paddle contact pad 122 is a conductive element for defining the location of the die attach paddle 120 on the mounting side 612 of the lead frame 602.

The inner lead pad 214 is a conductive element for defining the location of the inner lead 126 of FIG. 2 on the component side 610 of the lead frame 602. The inner lead contact pad 124 is a conductive element for defining the location of the inner lead 126 on the mounting side 612 of the lead frame 602.

The peripheral lead pad 218 is a conductive element for defining the location of the peripheral lead 130 of FIG. 2 on the component side 610 of the lead frame 602. The peripheral lead contact pad 128 is a conductive element for defining the location of the peripheral lead 130 on the mounting side 612 of the lead frame 602.

The lead frame 602 is formed from a conductive material, such as copper. The die attach paddle pad 212, the die attach paddle contact pad 122, the inner lead pad 214, the inner lead contact pad 124, the peripheral lead pad 218, and the peripheral lead contact pad 128 are formed of an etch-resistant material, such as a nickel-chromium alloy.

The bottom surfaces of the die attach paddle contact pad 122, the inner lead contact pad 124, and the peripheral lead contact pad 128 are coplanar and face away from the lead frame 602. The top surface of the die attach paddle contact pad 122, the inner lead contact pad 124, and the peripheral lead contact pad 128 are facing and coplanar with the bottom surface of the mounting side 612 of the lead frame 602.

Figure 7:
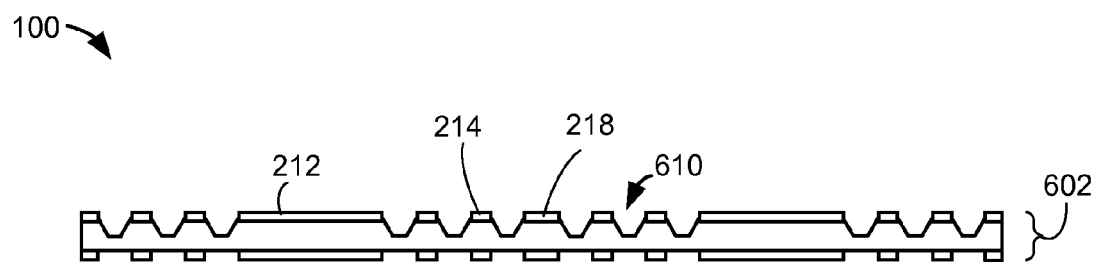
FIG. 7 is the structure of FIG. 6 in an etching phase.

Referring now to FIG. 7, therein is shown the structure of FIG. 6 in an etching phase. The integrated circuit packaging system 100 can include the lead frame 602 in an initial etch phase.

The lead frame 602 can be etched on the component side 610 to form the upper portions of the die attach paddle 120 of FIG. 2. The die attach paddle pad 212 is over the upper portion of the die attach paddle 120.

Etching the component side 610 can remove portions of the metal of the lead frame 602. The die attach paddle pad 212 protects the material of the lead frame 602 during the etch process to form the upper portion of the die attach paddle 120.

The lead frame 602 can be etched on the component side 610 to form the upper portion of the inner lead 126 of FIG. 2. The inner lead pad 214 is over the upper portion of the inner lead 126. The inner lead pad 214 protects the material of the lead frame 602 during the etch process to form the upper portion of the inner lead 126.

The lead frame 602 can be etched on the component side 610 to form the upper portion of the peripheral lead 130 of FIG. 2. The peripheral lead pad 218 is over the upper portion of the peripheral lead 130. The peripheral lead pad 218 protects the material of the lead frame 602 during the etch process to form the upper portion of the peripheral lead 130.

Figure 8:
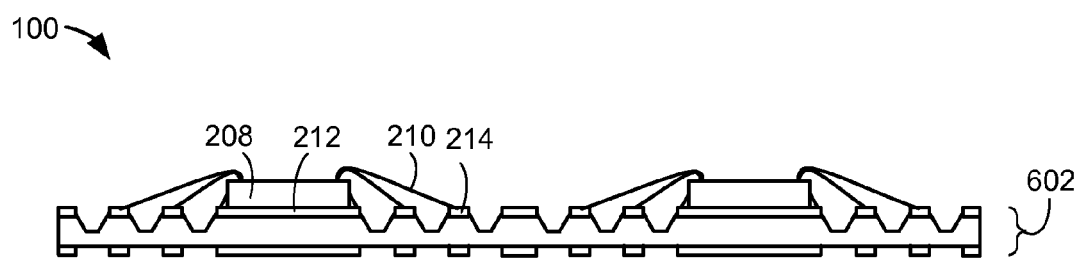
FIG. 8 is the structure of FIG. 7 in an interconnecting phase.

Referring now to FIG. 8, therein is shown the structure of FIG. 7 in an interconnecting phase. The integrated circuit packaging system 100 can include the lead frame 602 with the integrated circuit 208 mounted on the die attach paddle pad 212 in a die attach phase.

The lead frame 602 can include the integrated circuit 208 mounted on the die attach paddle pad 212. The integrated circuit 208 can be mounted on the die attach paddle pad 212 using an adhesive (not shown). The integrated circuit 208 can be coupled to the inner lead pad 214 with the electrical interconnect 210, such as a bond wire.

In another example, a flip chip can be mounted on the die attach paddle pad 212. The flip chip can be coupled to the inner lead pad 214 with the electrical interconnect 210.

Figure 9:
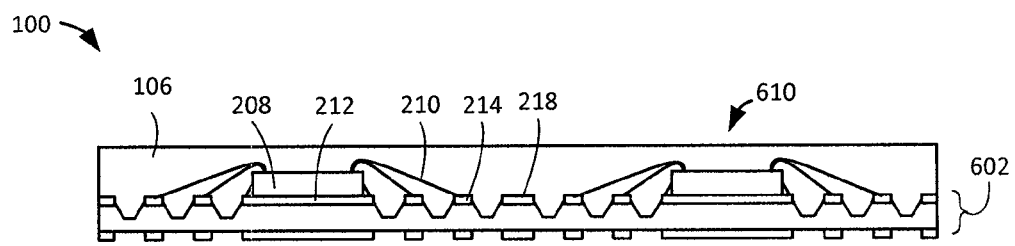
FIG. 9 is the structure of FIG. 8 in an encapsulating phase.

Referring now to FIG. 9, therein is shown the structure of FIG. 8 in an encapsulating phase. The integrated circuit packaging system 100 can include the integrated circuit 208 covered by an encapsulation 106 in an encapsulation phase.

The encapsulation 106 is formed on and over the component side 610 of the lead frame 602. The encapsulation 106, such as an epoxy molding compound, covers the integrated circuit 208, the electrical interconnect 210, the exposed portions of the die attach paddle pad 212, the inner lead pad 214, and the peripheral lead pad 218.

Figure 10:
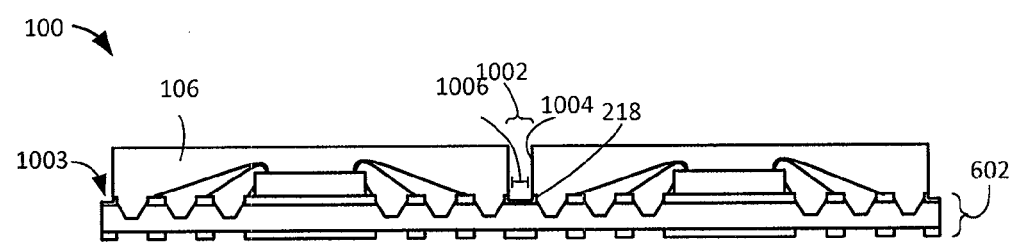
FIG. 10 is the structure of FIG. 9 in a trenching phase.

Referring now to FIG. 10, therein is the structure of FIG. 9 in a trenching phase. The integrated circuit packaging system 100 can include the encapsulation 106 over the lead frame 602 with a peripheral trench 1002 formed in the encapsulation 106 in a peripheral trenching phase.

The integrated circuit packaging system 100 can include the peripheral trench 1002 formed in the encapsulation 106 over the peripheral lead pad 218. The peripheral trench 1002 extends from the surface of the encapsulation 106 to the peripheral lead pad 218. The peripheral trench 1002 exposes the peripheral lead pad 218.

The peripheral trench 1002 is formed around the periphery of the integrated circuit packaging system 100. The peripheral trench 1002 is formed along a path defined by the peripheral lead pad 218. The peripheral trench 1002 has a trench width 1006. The peripheral trench 1002 has a lateral surface 1004.

The peripheral trench 1002 can be formed in a variety of methods. For example, the trench can be formed by sawing the encapsulation 106 with a saw blade. The peripheral trench 1002 is formed by sawing from the surface of the encapsulation 106 to the peripheral lead pad 218 and exposing a top surface 1003 of the peripheral lead pad 218.

In another example, the peripheral trench 1002 can be formed by laser cutting the encapsulation 106. The peripheral trench 1002 can be formed by laser cutting from the surface of the encapsulation 106 to the peripheral lead pad 218 and exposing the peripheral lead pad 218.

It has been discovered that exposing the peripheral lead pad 218 by forming the peripheral trench 1002 from the surface of the encapsulation 106 to the peripheral lead pad 218 provides multiple grounding contact points on the conductive shielding layer 204 of FIG. 2 that extends down to the peripheral lead pad 218. This can increase the reliability of the grounding of the conductive shielding layer 204.

Figure 11:
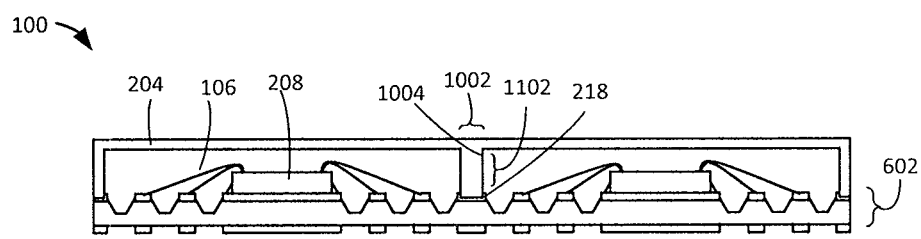
FIG. 11 is the structure of FIG. 10 in a conductive forming phase.

Referring now to FIG. 11, therein is shown the structure of FIG. 10 in a conductive forming phase. The integrated circuit packaging system 100 can include the conductive shielding layer 204 over the encapsulation 106 and over the peripheral trench 1002 in a deposit shielding layer phase.

The conductive shielding layer 204 can be applied on the encapsulation 106 and within the peripheral trench 1002. The conductive shielding layer 204 forms an electrical connection with the peripheral lead pad 218. The conductive shielding layer 204 can fill the peripheral trench 1002 forming a trench shielding 1102 as part of the conductive shielding layer 204. The conductive shielding layer 204 is formed on the lateral surface 1004 of the peripheral trench 1002.

It has been discovered that depositing the conductive shielding layer 204 over the encapsulation 106 and within the peripheral trench 1002 provides a faster and more uniform method of forming the electromagnetic interference shielding for covering the integrated circuit 208. This can reduce the number of steps required to form the electromagnetic interference shielding layer, reduce the complexity, and increase the reliability by forming the conductive shielding layer 204.

Figure 12:
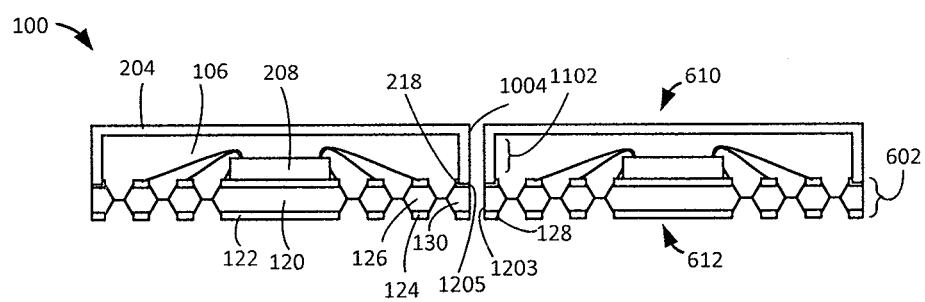
FIG. 12 is the structure of FIG. 11 in a singulation phase.

Referring now to FIG. 12, therein is shown the structure of FIG. 11 in a singulation phase. The integrated circuit packaging system 100 can include etching the mounting side of the lead frame 602 and singulating the lead frame 602 over the peripheral trench 1002 of FIG. 10 in a singulation and etch phase.

The lead frame 602 can be etched on the mounting side 612 to form the die attach paddle 120, the inner lead 126, and the peripheral lead 130. Etching the mounting side 612 of the lead frame 602 includes removing metal portions of the lead frame 602 that are not protected by the contact pads and exposing the encapsulation 106 on the mounting side 612.

The die attach paddle 120 is formed by etching the mounting side 612 where the surface of the mounting side of the lead frame 602 is not protected by the die attach paddle contact pad 122. The inner lead 126 is formed by etching the mounting side 612 where the surface of the mounting side 612 is not protected by the inner lead contact pad 124. The peripheral lead 130 is formed by etching where the surface of the mounting side 612 is not protected by the peripheral lead contact pad 128.

The lead frame 602 can be etched on the mounting side 612 to form the die attach paddle 120. The die attach paddle 120 is formed over the die attach paddle contact pad 122. The die attach paddle contact pad 122 protects the material of the lead frame 602 during the etch process to form the die attach paddle 120.

The lead frame 602 can be etched on the mounting side 612 to form the inner lead 126. The inner lead 126 is formed over the inner lead contact pad 124. The inner lead contact pad 124 protects the material of the lead frame 602 during the etch process to form the inner lead 126.

The lead frame 602 can be etched on the mounting side 612 to form the peripheral lead 130. The peripheral lead 130 is formed over the peripheral lead contact pad 128. The peripheral lead contact pad 128 protects the material of the lead frame 602 during the etch process to form the peripheral lead 130.

It has been discovered that etching both the component side 610 and the mounting side 612 to create the peripheral lead 130 can provide a method to create an exposed lead for forming an electrical connection. This can greatly simplify the application and reliability of the grounding of the conductive shielding layer 204. By forming an electrical connection between the conductive shielding layer 204 and the peripheral lead 130 that is coupled to the voltage, such as power, a voltage reference, or ground, the conductive shielding layer 204 will also be coupled to the voltage. By coupling the conductive shielding layer 204 to the voltage, the conductive shielding layer 204 will isolate the integrated circuit 208 from any electromagnetic interference that can be present outside the conductive shielding layer 204. The conductive shielding layer 204 can also be used to prevent any electromagnetic interference generated by the integrated circuit 208 from escaping into the system environment beyond the conductive shielding layer 204, thus providing electromagnetic isolation to the system environment.

The integrated circuit packaging system 100 can be formed by singulating the lead frame 602 over the center of the peripheral trench 1002 and the trench shielding 1102 exposing a cross-section of the peripheral lead pad 218, the peripheral lead 130, and a bottom pad 128. The conductive shielding layer 204 can be singulated along the trench shielding 1102 and through the center of the trench shielding 1102 and leaving a portion of the conductive shielding layer 204 covering the lateral surface 1004 of the encapsulation 106 and forming an electrical connection to the peripheral lead pad 218. The singulation exposes the peripheral lead 130 and the peripheral lead pad 218 from the encapsulation 106 and forms an exposed lateral lead surface 1203 of the peripheral lead 130 and an exposed lateral pad surface 1205 of the peripheral lead pad 218. The exposed lateral lead surface 1203 is coplanar to the exposed lateral pad surface 1205. An exposed portion of the peripheral lead pad 218 is coplanar to the lateral side 216 of the conductive shielding layer 204.

The conductive shielding layer 204 can be singulated in a variety of methods. For example, the conductive shielding layer 204 can be singulated using a saw blade with a thickness less than thickness of the peripheral trench 1002. Using a thinner saw blade can allows the trench shielding 1102 to be cut while leaving a portion of the conductive shielding layer 204 attached to the lateral surface 1004 of the peripheral trench 1002. In another example, the conductive shielding layer 204 can be singulated using a laser cutter with a beam diameter less than the thickness of the peripheral trench 1002.

It has been discovered that singulating the integrated circuit packaging system 100 along the trench shielding 1102 can increase the uniformity and reliability of the conductive shielding layer 204 on the lateral surface 1004 of the peripheral trench 1002. This can simplify the steps needed to apply a conductive layer on the side of the integrated circuit packaging system 100.

Figure 13:
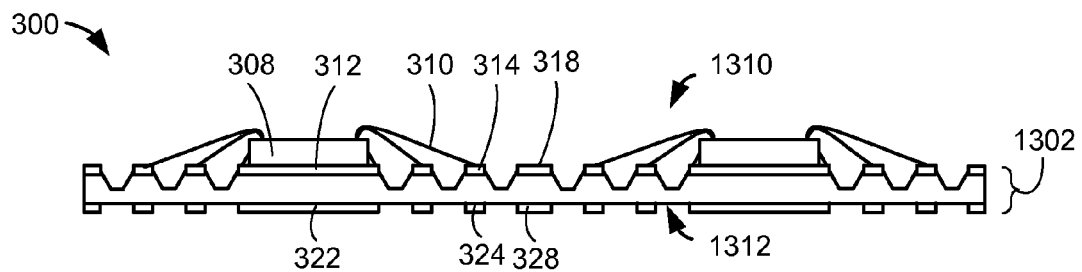
FIG. 13 is the integrated circuit packaging system in FIG. 3 in an interconnecting phase.

Referring now to FIG. 13, therein is shown the integrated circuit packaging system in FIG. 3 in an interconnecting phase. The integrated circuit packaging system 300 can include a lead frame 1302 with the integrated circuit 308 mounted on the die attach paddle pad 312 in a die attach phase.

The lead frame 1302 can be provided having a component side 1310 and a mounting side 1312. The component side 1310 can include the die attach paddle pad 312, the inner lead pad 314, and the peripheral lead pad 318. The mounting side 1312 can include the die attach paddle contact pad 322, the inner lead contact pad 324, and the peripheral lead contact pad 328.

The component side 1310 of the lead frame 1302 can expose the upper portions of the die attach paddle 320 of FIG. 3, the inner lead 326 of FIG. 3, and the peripheral lead 330 of FIG. 3. The die attach paddle pad 312 is over the upper portion of the die attach paddle 320. The inner lead pad 314 is over the upper portion of the inner lead 326. The peripheral lead pad 318 is over the upper portion of the peripheral lead 330.

The lead frame 1302 can include the integrated circuit 308 mounted on the die attach paddle pad 312. The integrated circuit 308 can be mounted on the die attach paddle pad 312 using an adhesive (not shown). The integrated circuit 308 can be coupled to the inner lead pad 314 with the electrical interconnect 310, such as a bond wire.

In another example, a flip chip can be mounted on the die attach paddle pad 312. The flip chip can be coupled to the inner lead pad 314 with the electrical interconnect 310.

Figure 14:
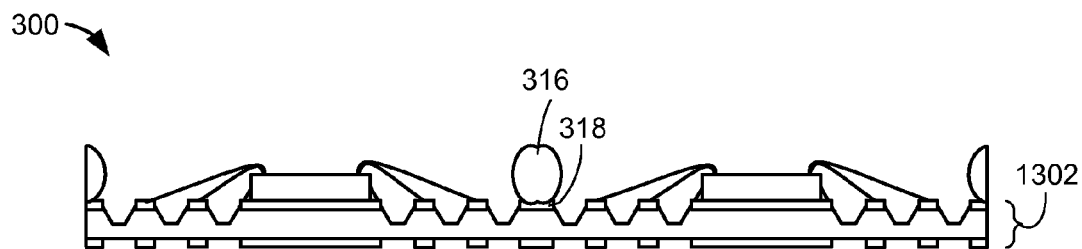
FIG. 14 is the structure of FIG. 13 in a mounting phase.

Referring now to FIG. 14, therein is shown the structure of FIG. 13 in a mounting phase. The integrated circuit packaging system 300 can include the lead frame 1302 with the peripheral interconnect 316 mounted on the peripheral lead pad 318 in a peripheral interconnect phase.

The integrated circuit packaging system 300 can include the peripheral interconnect 316 mounted on the peripheral lead pad 318. The peripheral interconnect 316 is a conductive element that can provide an electrical connection from the peripheral lead pad 318 to the top of the integrated circuit packaging system 300.

The peripheral interconnect 316 can be mounted on the peripheral lead pad 318 in a variety of methods. For example, the peripheral interconnect, such as a solder ball, can be formed directly on the peripheral lead pad 318. In another example, the peripheral interconnect 316 can be pre-formed and then attached to the peripheral lead pad 318 using a conductive adhesive (not shown).

Figure 15:
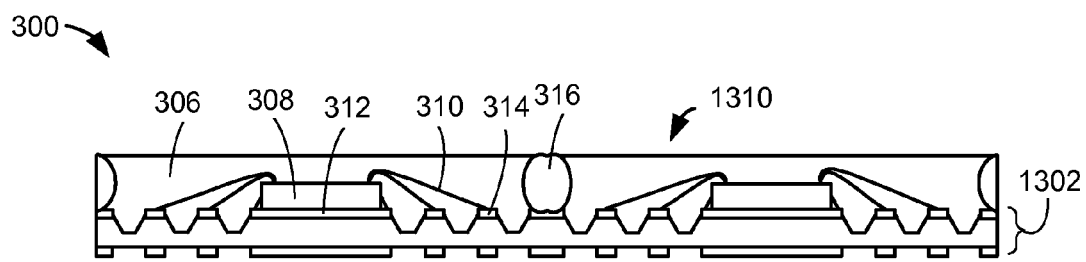
FIG. 15 is the structure of FIG. 14 in an encapsulating phase.

Referring now to FIG. 15, therein is shown the structure of FIG. 14 in an encapsulating phase. The integrated circuit packaging system 300 can include the integrated circuit 308 covered by the encapsulation 306 in an encapsulation phase.

The encapsulation 306 is formed on and over the component side 1310 of the lead frame 1302. The encapsulation 306, such as an epoxy molding compound, covers the integrated circuit 308, the electrical interconnect 310, the exposed portions of the die attach paddle pad 312, the inner lead pad 314, and the peripheral lead pad.

The encapsulation 306 is formed on the inner lead pad 314 and on the side of the peripheral interconnect 316 extending up to the top of the peripheral interconnect 316. The encapsulation 306 exposing the top surface of the peripheral interconnect 316. The top surface of the encapsulation 306 is substantially coplanar with the top surface of the peripheral interconnect 316.

Figure 16:
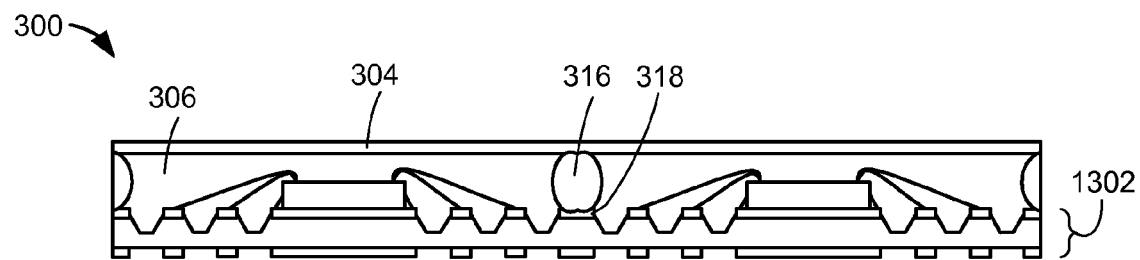
FIG. 16 is the structure of FIG. 15 in a conductive forming phase.

Referring now to FIG. 16, therein is shown the structure of FIG. 15 in a conductive forming phase. The integrated circuit packaging system 300 can include the conductive shielding layer 304 over the encapsulation 306 and over the peripheral interconnect 316 in a deposit shielding layer phase.

The conductive shielding layer 304 can be formed on top of the encapsulation 306 and on the peripheral interconnect 316. The conductive shielding layer 304 forms an electrical connection with the peripheral interconnect 316 and the peripheral lead pad 318. The conductive shielding layer 304 is formed on the side of the peripheral interconnect 316 and extends to the top of the peripheral interconnect 316.

It has been discovered that depositing the conductive shielding layer 304 over the encapsulation 306 and the peripheral interconnect 316 provides a simple method of forming the conductive shielding layer 304 covering the integrated circuit 308 and electrically connected to a power, a voltage reference, or ground. This can reduce the number of steps required to form a shielding layer, reduce the complexity, and increase the reliability of forming the conductive shielding layer 304.

Figure 17:
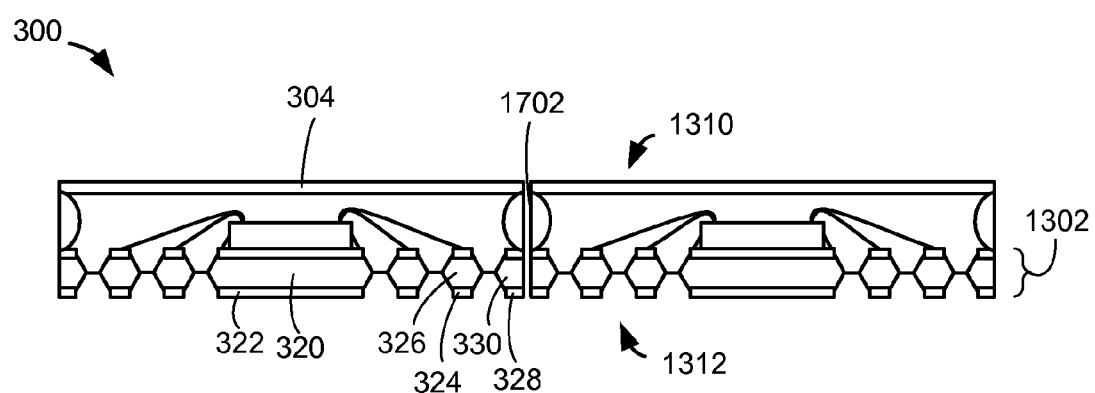
FIG. 17 is the structure of FIG. 16 in a singulation phase.

Referring now to FIG. 17, therein is shown the structure of FIG. 16 in a singulation phase. The integrated circuit packaging system 300 can include etching the mounting side 1312 of the lead frame 1302 and singulating the lead frame 1302 over the peripheral interconnect 316 of FIG. 16 in a singulation and etch phase.

The lead frame 1302 can be etched on the mounting side 1312 to form the die attach paddle 320, the inner lead 326, and the peripheral lead 330. The die attach paddle 320 is formed by etching the mounting side 1312 where the surface of the mounting side 1312 of the lead frame 1302 is not protected by the die attach paddle contact pad 322. The inner lead 326 is formed by etching the mounting side 1312 where the surface of the mounting side 1312 is not protected by the inner lead contact pad 324. The peripheral lead 330 is formed by etching where the surface of the mounting side 1312 is not protected by the peripheral lead contact pad 328.

The lead frame 1302 can be etched on the mounting side 1312 to form the die attach paddle 320. The die attach paddle 320 is formed over the die attach paddle contact pad 322. The die attach paddle contact pad 322 protects the material of the lead frame 1302 during the etch process to form the die attach paddle 320.

The lead frame 1302 can be etched on the mounting side 1312 to form the inner lead 326. The inner lead 326 is formed over the inner lead contact pad 324. The inner lead contact pad 324 protects the material of the lead frame 1302 during the etch process to form the inner lead 326.

The lead frame 1302 can be etched on the mounting side 1312 to form the peripheral lead 330. The peripheral lead 330 is formed over the peripheral lead contact pad 328. The peripheral lead contact pad 328 protects the material of the lead frame 1302 during the etch process to form the peripheral lead 330.

It has been discovered that etching both the component side 1310 and the mounting side 1312 to create the peripheral lead 330 can provide a method to create an exposed lead for forming an electrical connection to the conductive shielding layer 304. This can greatly simplify the application and reliability of the grounding of the conductive shielding layer 304.

The integrated circuit packaging system 300 can be formed by singulating the lead frame 1302 over the center of the peripheral interconnect 316. The lead frame 1302 can be singulated along the center of the peripheral interconnect 316 providing an electrical connection to the peripheral lead pad 318 of FIG. 16 and exposing a lateral side 1702 of the peripheral interconnect 316.

The conductive shielding layer 304 can be singulated in a variety of methods. For example, the conductive shielding layer 304 can be singulated using a saw blade with a thickness less than thickness of the peripheral interconnect 316. In another example, the conductive shielding layer 304 can be singulated using a laser cutter with a beam diameter less than the thickness of the peripheral interconnect 316.

It has been discovered that singulating the integrated circuit packaging system 300 though the center of the peripheral interconnect 316 provides a simple means of forming the conductive shielding layer 304 connected via the peripheral interconnect 316 to the peripheral lead pad 318 and further connected to a ground voltage. This can simplify the steps needed to apply a grounded electromagnetic interference shielding to the integrated circuit packaging system 300.

Figure 18:
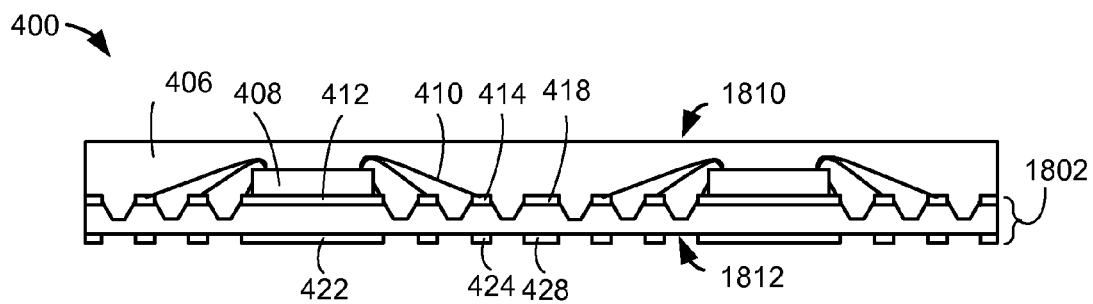
FIG. 18 is the integrated circuit packaging system in FIG. 4 in an encapsulating phase.

Referring now to FIG. 18, therein is shown the integrated circuit packaging system 400 in FIG. 4 in an encapsulating phase. The integrated circuit packaging system 400 can include a lead frame 1802 with the integrated circuit 408 encapsulated in the encapsulation 406 in an encapsulation phase.

The lead frame 1802 can be provided having a component side 1810 and a mounting side 1812. The component side 1810 can include the die attach paddle pad 412, the inner lead pad 414, and the peripheral lead pad 418. The mounting side 1812 can include the die attach paddle contact pad 422, the inner lead contact pad 424, and the peripheral lead contact pad 428.

The component side 1810 of the lead frame 1802 can expose the upper portions of the die attach paddle 420 of FIG. 4, the inner lead 426 of FIG. 4, and the peripheral lead 430 of FIG. 4. The die attach paddle pad 412 is over the upper portion of the die attach paddle 420. The inner lead pad 414 is over the upper portion of the inner lead 426. The peripheral lead pad 418 is over the upper portion of the peripheral lead 430.

The lead frame 1802 can include the integrated circuit 408 mounted on the die attach paddle pad 412. The integrated circuit 408 can be mounted on the die attach paddle pad 412 using an adhesive (not shown). The integrated circuit 408 can be coupled to the inner lead pad 414 with the electrical interconnect 410, such as bond wires.

In another example, a flip chip can be mounted on the die attach paddle pad 412. The flip chip can be coupled to the inner lead pad 414 with the electrical interconnect 410.

The encapsulation 406 is formed on and over the component side 1810 of the lead frame 1802. The encapsulation 406, such as an epoxy molding compound, covers the integrated circuit 408, the electrical interconnect 410, the exposed portions of the die attach paddle pad 412, the inner lead pad 414, and the peripheral lead pad.

Figure 19:
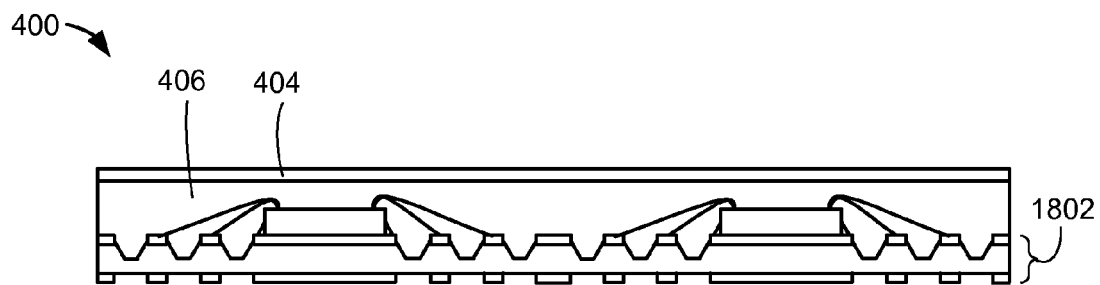
FIG. 19 is the structure of FIG. 18 in a conductive forming phase.

Referring now to FIG. 19, therein is shown the structure of FIG. 18 in a conductive forming phase. The integrated circuit packaging system 400 can include the conductive shielding layer 404 over the encapsulation 406 in a deposit shielding layer phase. The conductive shielding layer 404 can be formed on the encapsulation 406.

Figure 20:
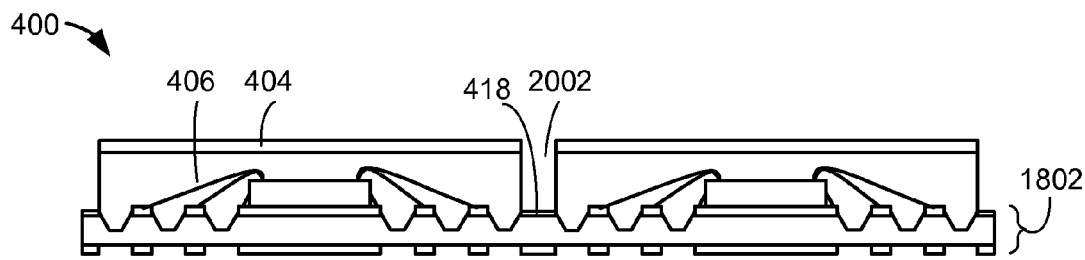
FIG. 20 is the structure of FIG. 19 in a trenching phase.

Referring now to FIG. 20, therein is shown the structure of FIG. 19 in a trenching phase. The integrated circuit packaging system 400 can include the conductive shielding layer 404 over the encapsulation 406 with a peripheral trench 2002 in a peripheral trenching phase.

The integrated circuit packaging system 400 can include the peripheral trench 2002 formed above the peripheral lead pad 418. The peripheral trench 2002 extends from the conductive shielding layer 404, though the encapsulation 406, and extends on to the peripheral lead pad 418. The peripheral trench 2002 exposes the peripheral lead pad 418. The peripheral trench 2002 is formed around the periphery of the integrated circuit packaging system 400. The peripheral trench 2002 is formed along a path defined by the peripheral lead pad 418.

The peripheral trench 2002 can be formed in a variety of methods. For example, the peripheral trench 2002 can be formed by sawing through the conductive shielding layer 404 and the encapsulation 406 with a saw blade. The peripheral trench 2002 is formed by sawing from the surface of the conductive shielding layer 404 to the peripheral lead pad 418.

In another example, the trench can be formed by laser cutting the conductive shielding layer 404 and the encapsulation 406. The peripheral trench 2002 can be formed by laser cutting from the surface of the conductive shielding layer 404 to the peripheral lead pad 418.

Figure 21:
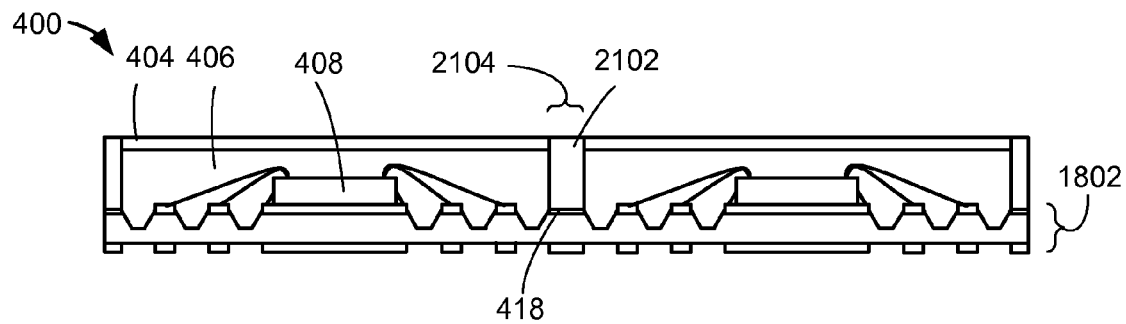
FIG. 21 is the structure of FIG. 20 in a filling phase.

Referring now to FIG. 21, therein is shown the structure of FIG. 20 in a filling phase. The integrated circuit packaging system 400 can include the conductive shielding layer 404 over the encapsulation 406 with an electrically conductive paste 2102 filing the peripheral trench 2002 of FIG. 20 in a deposit conductive paste phase.

The electrically conductive paste 2102 can be formed in the peripheral trench 2002 to create an electrical connection between the conductive shielding layer 404 and the peripheral lead pad 418. The electrically conductive paste 2102 can be a conductive epoxy paste with a low bulk resistivity. The electrically conductive paste 2102 can be cured in place after being formed in the peripheral trench 2002 to form a conductor paste plug 2104.

It has been discovered that forming the electrically conductive paste 2102 in the peripheral trench 2002 provides a simple method of forming an electrical connection between the conductive shielding layer 404 and the peripheral lead pad 418. This can reduce the number of steps required to form a shielding layer, reduce the complexity, and increase the reliability of forming the electromagnetic shield around the integrated circuit 408.

Figure 22:
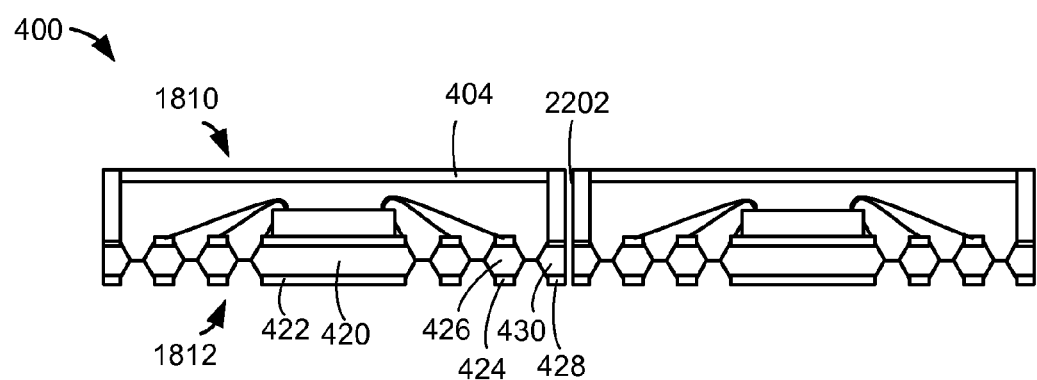
FIG. 22 is the structure of FIG. 21 in a singulation phase.

Referring now to FIG. 22, therein is shown the structure of FIG. 21 in a singulation phase. The integrated circuit packaging system 400 can include etching the mounting side of the lead frame 1802 of FIG. 21 and singulating the lead frame 1802 over the peripheral trench 2002 of FIG. 20 in a singulation and etch phase.

The lead frame 1802 can be etched on the mounting side 1812 to form the die attach paddle 420, the inner lead 426, and the peripheral lead 430. The die attach paddle 420 is formed by etching the mounting side 1812 where the surface of the mounting side of the lead frame 1802 is not protected by the die attach paddle contact pad 422. The inner lead 426 is formed by etching the mounting side 1812 where the surface of the mounting side 1812 is not protected by the inner lead contact pad 424. The peripheral lead 430 is formed by etching where the surface of the mounting side 1812 is not protected by the peripheral lead contact pad 428.

The lead frame 1802 can be etched on the mounting side 1812 to form the die attach paddle 420. The die attach paddle 420 is formed over the die attach paddle contact pad 422. The die attach paddle contact pad 422 protects the material of the lead frame 1802 during the etch process to form the die attach paddle 420.

The lead frame 1802 can be etched on the mounting side 1812 to form the inner lead 426. The inner lead 426 is formed over the inner lead contact pad 424. The inner lead contact pad 424 protects the material of the lead frame 1802 during the etch process to form the inner lead 426.

The lead frame 1802 can be etched on the mounting side 1812 to form the peripheral lead 430. The peripheral lead 430 is formed over the peripheral lead contact pad 428. The peripheral lead contact pad 428 protects the material of the lead frame 1802 during the etch process to form the peripheral lead 430.

It has been discovered that etching both the component side 1810 and the mounting side 1812 to create the peripheral lead can provide a method to create an exposed lead for forming an electrical connection to a conductive shielding layer. This can greatly simplify the application and reliability of the grounding of the conductive shielding layer 404.

The integrated circuit packaging system 400 can be formed by singulating the lead frame 1802 over the center of the conductive paste plug 2104 of FIG. 21. The lead frame 1802 can be singulated along the center of the conductive paste plug 2104 providing an electrical connection from the conductive shielding layer 404 through the conductive paste plug 2104 to the peripheral lead pad 418 of FIG. 21 and exposing a lateral surface 2202.

The integrated circuit packaging system 400 can be singulated in a variety of methods. For example, the conductive shielding layer 404 can be singulated using a saw blade with a thickness less than thickness of the conductive paste plug 2104. In another example, the conductive shielding layer 404 can be singulated using a laser cutter with a beam diameter less than the thickness of the conductive paste plug 2104.

It has been discovered that singulating the integrated circuit packaging system 400 though the center of the conductive paste plug 2104 provides a simple means of forming the conductive shielding layer 404 connected via the conductive paste plug 2104 to the peripheral lead pad 418 and further connected to a ground voltage. This can simplify the steps needed to apply a grounded electromagnetic shield to the integrated circuit packaging system 400.

Figure 23:
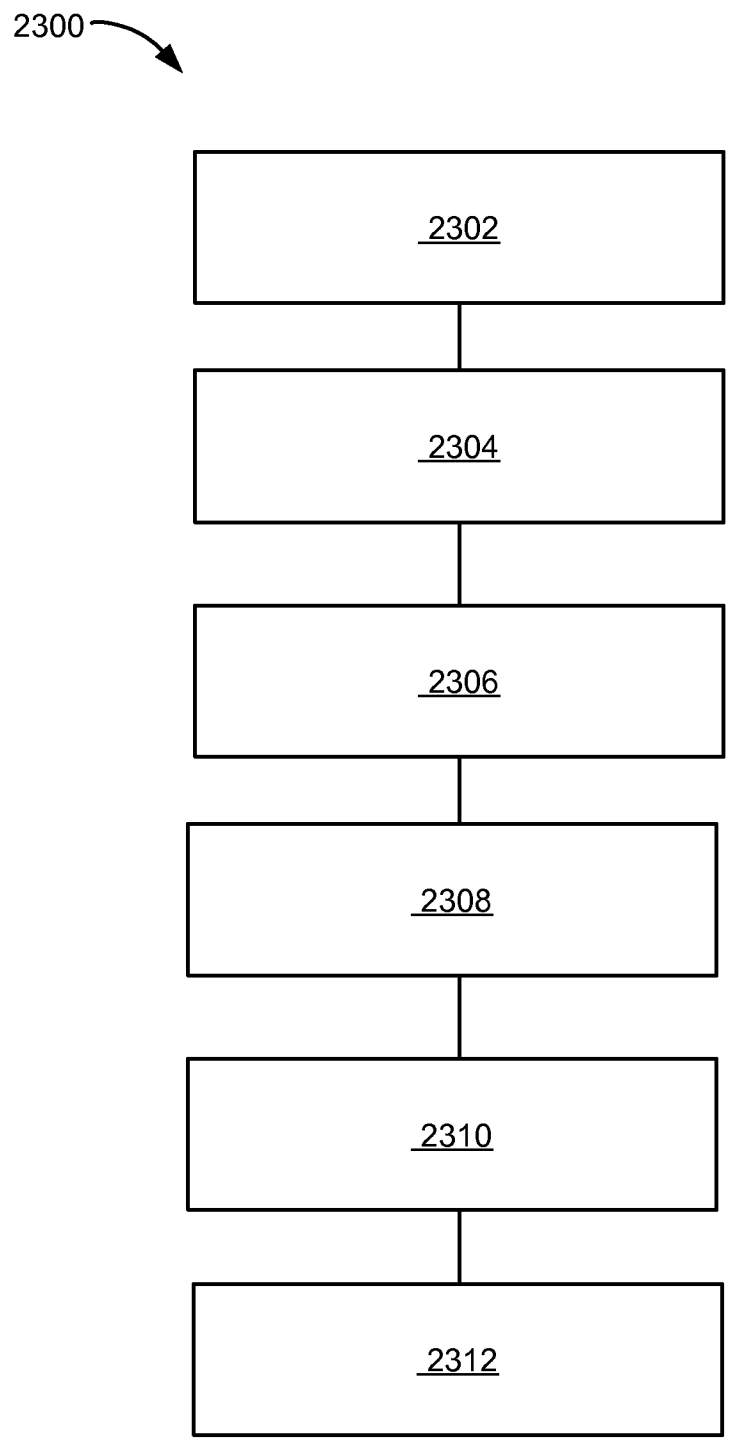
FIG. 23 is a flow chart of a method for manufacturing the integrated circuit packaging system in a further embodiment of the present invention.

Referring now to FIG. 23, therein is shown a flow chart of a method for manufacturing the integrated circuit packaging system in a further embodiment of the present invention. An integrated circuit packaging system 2300 includes: providing a lead frame having a die attach paddle pad and a peripheral lead pad with an inner lead pad between the die attach paddle pad and the peripheral lead pad in a block 2302; forming a component side of the lead frame for exposing an upper portion of a peripheral lead under the peripheral lead pad in a block 2304, forming an encapsulation on the lead frame and the upper portion of the peripheral lead in a block 2306, exposing the peripheral lead pad in a block 2308, depositing a conductive shielding layer on the encapsulation connected to the peripheral lead pad in a block 2310, and forming a mounting side in a block 2312 of the lead frame for forming a lower portion of the peripheral lead over a peripheral lead contact pad.

It has been discovered that the present invention thus has numerous aspects.

A principle aspect that has been unexpectedly discovered is that the present invention can provide a simplified mechanism for providing electromagnetic interference shielding.

Another aspect is the present invention utilizes only standard package assembly processes, yet is extremely reliable. There is minimal thickness added to the finished package and no additional horizontal space required to implement the present invention.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for providing electromagnetic interference shielding for integrated circuit packages. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead frame having a die attach paddle pad and a peripheral lead pad with an inner lead pad between the die attach paddle pad and the peripheral lead pad;
   forming a component side of the lead frame for exposing an upper portion of a peripheral lead under the peripheral lead pad;
   forming an encapsulation on the lead frame and the upper portion of the peripheral lead, the encapsulation completely covering a top surface of the peripheral lead pad;
   exposing the top surface of the peripheral lead pad from the encapsulation;
   depositing a conductive shielding layer over the top surface of the peripheral lead pad and on the encapsulation connected to the peripheral lead pad;
   forming a mounting side of the lead frame for forming a lower portion of the peripheral lead over a peripheral lead contact pad; and
   singulating the peripheral lead and the peripheral lead pad for forming an exposed lateral pad surface, a portion of the peripheral lead pad exposed from the conductive shielding layer and coplanar to a lateral surface of the conductive shielding layer.

2. The method as claimed in claim 1 wherein exposing the top surface of the peripheral lead pad includes:
   forming a peripheral trench in the encapsulation over the peripheral lead pad; and
   wherein:
   depositing the conductive shielding layer within the peripheral trench to the peripheral lead pad.

3. The method as claimed in claim 1 further comprising:
   forming a conductive paste plug in direct contact with the top surface of the peripheral lead pad; and
   wherein:
   depositing the conductive shielding layer includes depositing the conductive shielding layer on the conductive paste plug.

4. The method as claimed in claim 1 further comprising:
   forming a peripheral interconnect on the peripheral lead pad;
   providing a continuous peripheral lead, on the lead frame around the die attach paddle pad and the inner lead pad, for connecting to the peripheral lead pad; and
   wherein:
   forming the encapsulation over the lead frame leaving the peripheral interconnect exposed; and
   forming the conductive shielding layer includes forming the conductive shielding layer on the encapsulation and the peripheral interconnect.

5. The method as claimed in claim 1 further comprising singulating the integrated circuit package over the peripheral lead pad with a saw blade thinner than the thickness of a peripheral trench.

6. A method of manufacture of an integrated circuit packaging system comprising:
   providing a lead frame having a die attach paddle pad and a peripheral lead pad with an inner lead pad between the die attach paddle pad and the peripheral lead pad;
   forming a component side of the lead frame for exposing an upper portion of a peripheral lead under the peripheral lead pad;

forming an encapsulation on the lead frame, the inner lead and the upper portion of the peripheral lead, the encapsulation completely covering a top surface of the peripheral lead pad;

exposing the top surface of the peripheral lead pad from the encapsulation;

attaching a peripheral interconnect on the peripheral lead pad;

depositing a conductive shielding layer over the peripheral lead pad and on the encapsulation for forming an electrical connection to the peripheral lead pad, a portion of the peripheral lead pad exposed from the conductive shielding layer and coplanar with a lateral side of the conductive shielding layer pad;

forming a mounting side of the lead frame for forming a lower portion of the peripheral lead over a peripheral lead contact pad; and singulating the peripheral lead and the peripheral lead pad for forming an exposed lateral pad surface, the exposed lateral pad surface exposed from the encapsulation.

7. The method as claimed in claim 6 further comprising:
forming a peripheral interconnect on the peripheral lead pad; and wherein:
forming the encapsulation over the lead frame leaving the peripheral interconnect exposed; and
forming the conductive shielding layer includes forming the conductive shielding layer on the encapsulation and the peripheral interconnect.

8. The system as claimed in claim 6 wherein depositing the conductive shielding layer includes depositing the conductive shielding layer on the peripheral interconnect for forming an electrical connection to the peripheral lead pad.

9. The method as claimed in claim 6 further comprising singulating the integrated circuit package around the die attach paddle pad and through the center of a peripheral interconnect.

10. The method as claimed in claim 6 further comprising singulating the integrated circuit package with a saw blade thinner than the thickness of the peripheral interconnect.

* * * * *